(12) United States Patent
Schulz-Harder et al.

(10) Patent No.: US 8,130,807 B2
(45) Date of Patent: Mar. 6, 2012

(54) DIODE LASER ARRAY AND METHOD FOR MANUFACTURING SUCH AN ARRAY

(75) Inventors: Jurgen Schulz-Harder, Lauf (DE); Andreas Meyer, Wenzenbach (DE); Volker Krause, Lonnig (DE); Christoph Ullmann, Bad Honnef (DE)

(73) Assignees: Laserline Gesellschaft fur Entwicklung und Vertrieb Von Diddenlasern GmbH, Mulheim, Karlich (DE); Curamik Electronics GmbH, Eschenbach (DE)

( * ) Notice: Subject to any disclaimer, the term of this patent is extended or adjusted under 35 U.S.C. 154(b) by 0 days.

(21) Appl. No.: 12/068,746

(22) Filed: Feb. 11, 2008

(65) Prior Publication Data
US 2008/0192785 A1    Aug. 14, 2008

(30) Foreign Application Priority Data

Feb. 13, 2007  (DE) .................. 10 2007 007 661
Feb. 15, 2007  (DE) .................. 10 2007 008 027

(51) Int. Cl.
*H01S 5/00* (2006.01)

(52) U.S. Cl. .................................................. 372/50.12
(58) Field of Classification Search ............. 372/36, 372/50.12
See application file for complete search history.

(56) References Cited

U.S. PATENT DOCUMENTS

| 5,903,583 | A * | 5/1999 | Ullman et al. ............... 372/35 |
| 6,647,035 | B1 * | 11/2003 | Freitas et al. ............... 372/36 |
| 2002/0081778 | A1 * | 6/2002 | Inoue et al. ............... 438/122 |
| 2004/0082112 | A1 | 4/2004 | Stephens |
| 2004/0165628 | A1 * | 8/2004 | Rice ............... 372/36 |

FOREIGN PATENT DOCUMENTS

| EP | 1696526 | 8/2006 |
| JP | 2003023207 | 1/2003 |

* cited by examiner

*Primary Examiner* — Jessica Stultz
*Assistant Examiner* — Patrick Stafford
(74) *Attorney, Agent, or Firm* — Welsh Flaxman & Gitler LLC

(57) ABSTRACT

The invention relates to a diode laser array with at least one laser bar and having at least one emitter and a heat sink array for cooling the at least one laser bar.

24 Claims, 4 Drawing Sheets

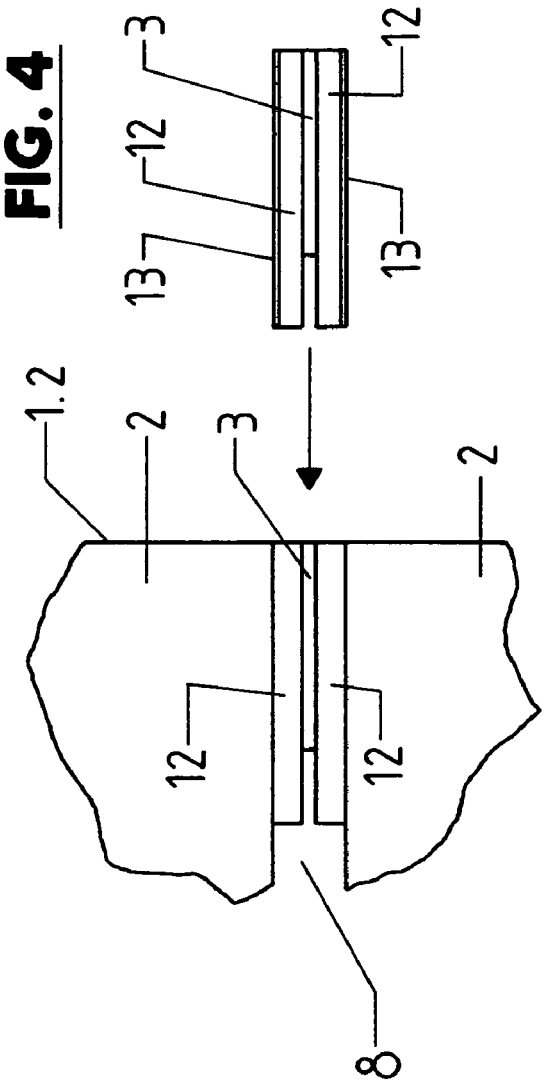
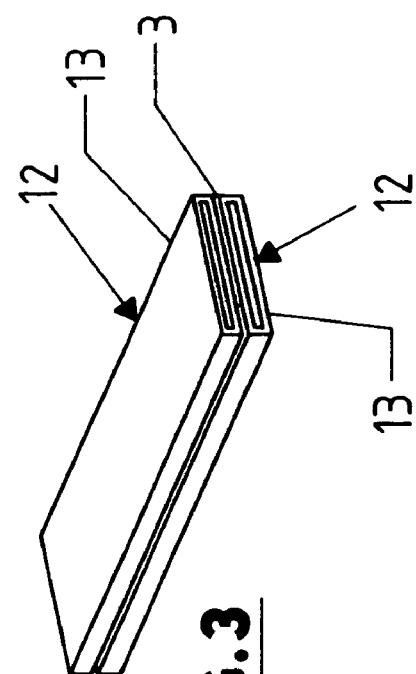
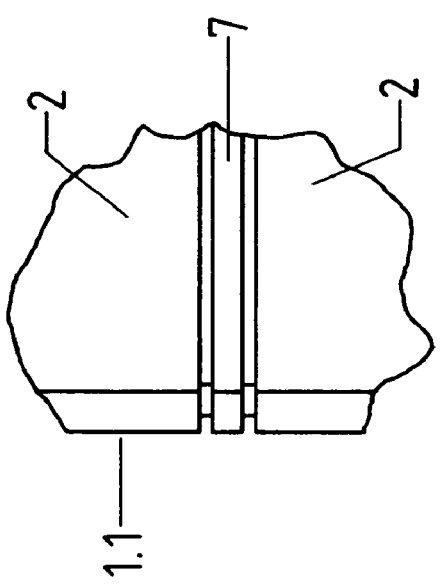

DIODE LASER ARRAY AND METHOD FOR MANUFACTURING SUCH AN ARRAY

BACKGROUND OF THE INVENTION

The invention relates to a diode laser array and to a method for manufacturing a laser diode array.

High-power diode lasers today are based primarily on broad-area lasers with chip dimensions of 0.5 . . . 1 mm× 1 . . . 4 mm and a chip height of 100 . . . 150 µm. The laser active layer of the chip, in which the laser radiation or light is generated, is aligned along the larger edge length of the chip; the cleaved edges having very good flatness and therefore forming the end and output mirrors of the laser. The laser radiation exits the output mirror at a width of typically only 50 . . . 200 µm from the chip material. An emitter width of 100 µm can achieve an output power of up to 15 W.

For high-power diode layers, such wide area lasers or emitters are combined to form laser bars, in which up to one hundred individual emitters are provided successively on a length of up to 10 mm. The end mirror and output mirror then both extend over the entire length of such a laser bar, in order to achieve an output power between 100 and 150 W, for example.

For cooling, the laser bars are normally soldered with their p-side to heat sinks, in particular to active heat sinks, i.e. to heat sinks which, or the canals or canal structures of which, are flowed through with a coolant, for example cooling water.

In particular in the existing art, in order to increase the power output, diode laser arrays are stacked, namely with several laser bars arranged one on top of the other and each provided on a heat sink, respectively.

The disadvantage of such diode laser arrays or arrangements known in the art is that the laser bars or emitters are cooled on only one side, i.e. on the mounting side or p-side, while the other side, for example the n-side of the laser chips of the laser bar is used only for bonding.

Further, especially the stacked diode layer arrays or arrangements known in the art have a complex design and are susceptible to failure, in particular because the design provides for numerous transition points for the cooling water, which have to be sealed, for example with O-rings. Further, numerous transition points or connections are also necessary for the power supply.

Known in the art is the DCB or Direct Copper Bonding technology, which is used to bond metal layers or sheets (e.g. copper sheets or foils) with each other and/or with ceramic or ceramic layers, namely using metal or copper sheets or metal or copper foils, which are provided on their surfaces with a layer or coating (hot-melt layer) resulting from a chemical bond between the metal and a reactive gas, preferably oxygen. In this method, which is described for example in US-PS 37 44 120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB process then comprises, for example, the following process steps:
- oxidation of a copper foil so as to produce an even copper oxide layer;
- a placing the copper foil on the ceramic layer;
- heating the composite to a process temperature between approx. 1025 and 1083° C., e.g. to approx. 1071° C.;
- cooling to room temperature.

Also known in the art is the so-called active soldering method (DE 22 13 115; EP-A-153 618), e.g. for bonding metal layers or metal foils forming metallizations, in particular also of copper layers or copper foils, with ceramic material. In this process, which is used especially for manufacturing a metal-ceramic substrate, a bond is produced at a temperature of ca. 800-1000° C. between a metal foil, for example copper foil, and a ceramic substrate, for example aluminum nitride ceramic, using a hard solder, which in addition to a main component such as copper, silver and/or gold also contains an active metal. This active metal, which is at least one element of the group Hf, Ti, Zr, Nb, Ce, creates a bond between the solder and the ceramic through a chemical reaction, while the bond between the solder and the metal is a metallic hard solder bond.

It is an object of the invention is to present a diode laser array that eliminates the disadvantages of the prior art and enables a simplified design with an improved cooling effect.

SUMMARY OF THE INVENTION

In the diode laser array according to the invention, each laser bar is cooled on two sides, i.e. both on the n-side and on the p-side of the chips or emitters. This not only improves the cooling effect, so that higher outputs are possible, but the two-sided cooling also results in a thermo-mechanical symmetrical design, which in particular can also reduce negative influences resulting from the differences of the thermal expansion coefficients between the material of the respective heat sink and the semiconductor material or the material of the submounts by means of which the laser bars are bonded to the heat sinks.

In a preferred embodiment of the invention the respective laser bar is provided on both sides with at least one submount, respectively, therefore forming a laser bar array with the submounts. Suitable materials for the intermediate layers or submounts by which the respective laser bar is bonded to the adjacent heat sink are copper/tungsten alloys with a thermal expansion coefficient (CTE) of 6-9 ppm/K.

In the invention, the at least two heat exchangers or heat sinks provided on both sides of the at least one laser bar or the at least one laser bar array, and the at least one insulating layer provided between the heat sinks, are bonded to each other to form a monolithic heat sink array. Monolithic within the scope of the invention means that the bond is not manufactured using mechanical bonding elements such as screws, clamping bolts or similar clamping and/or bonding elements, but rather through material-bonding processes, in particular DCB or active soldering or other soldering processes or bonding processes, for example also by adhesion.

In a preferred embodiment of the invention, compensating elements are provided on the top and bottom sides of the heat sink array or arrangement, preferably in the form of compensating layers, namely for preventing thermal deformations of the heat sink array, in particular during assembly, but also during operation.

The heat sink array is symmetrical or essentially symmetrical to a middle plane. Due to this symmetrical design, mounting by means of soldering is possible also with greatly reduced distortion of the laser chip or laser bar (smile effect), even if the submounts and the material of the heat sinks have a significantly different thermal expansion coefficient (CTE).

The respective active heat sink consists, at least in the mounting area of the respective laser bar, of several metal or copper layers, which are bonded to each other for example by means of DCB technology or active soldering. The thermal expansion coefficient of the heat sink is therefore on the order of 16 ppm/K and therefore differs significantly from the thermal expansion coefficient of the submount. Due to the symmetrical design, i.e. due to the use of two submounts or intermediate layers on both sides of the respective laser bar and the adjacent active heat sink, there is no bending of the laser chip, at least no significant bending of the chip that would negatively affect the later beam shaping, despite solder mounting of the submounts on the heat sinks.

The manufacture of the diode laser array according to the invention takes place for example in the manner that the laser bar is provided with a submount on both sides using a hard solder, for example an AuSn solder, and then is inserted between two active heat exchangers of a heat exchanger array comprising said heat exchangers in a stack, after which the submounts are soldered to the adjacent heat exchangers.

The two submounts or support layers provided on both sides of the laser bar have the same or at least essentially the same dimensions and material properties, so that after the soldering process, the desired straight design of the respective laser bar bonded on both sides with an active heat exchanger, respectively, is maintained.

The dimensions of the submounts are adapted to the respective laser bars, for example so that the output mirror of the laser bar is flush or nearly flush with one side or edge of the respective submount, while the submounts on the opposite side protrude, for example, beyond the laser bar.

The heat sink array formed by the heat sinks and the insulating layers located in between them forms a monolithic unit, therefore eliminating transition points for the liquid coolant, for example water, that would have to be sealed by seals. The active heat sinks made of a metallic material at least in the mounting area also enable the electric contacting of the laser bars in an especially simple manner.

In further embodiments of the invention it is possible
that the at least one laser bar is electrically connected on both sides, i.e. both with its n-side and with its p-side, with the heat sink consisting of an electrically conductive material at least in the mounting area, and/or that an intermediate layer or a submount made of a material that is at least highly thermally conductive, preferably both highly thermally and electrically conductive, is provided in the bond between the at least one laser bar and the respective heat sink, for reduction of the effect of the different thermal expansion coefficient between the semiconductor material of the laser bar and the metallic material of the heat sink, and/or that the intermediate layer or submount consists of a CuW alloy, and/or that the at least one laser bar provided on both sides with submounts is held in the gap formed between the at least two heat sinks, and/or that the gap is formed by the at least one insulating layer between the at least two heat sinks, and/or that the heat sinks each consist of a plurality of two-dimensionally connected layers, of which inner layers are structured to form a cooling structure comprising a plurality of cooling channels, and/or that the layers forming the heat sinks are bonded using DCB technology or active soldering, and/or that the at least one insulating layer provided between two heat sinks is a ceramic layer, for example of aluminum oxide and/or aluminum nitride, and/or that the at least one insulating layer is provided on at least one surface with a metallization bonded to the adjacent heat sink, for example with a metal layer or metal foil forming said metallization, and/or that the metallization is applied using DCB technology or active soldering, and/or that the heat sinks and the at least one insulating layer are bonded to each other using DCB technology or active soldering, and/or that it comprises more than two heat sinks bonded in a stack to form a heat sink array, and/or that at least one insulating layer is also provided in the heat sink array between two heat sinks located on both sides of at least one laser bar, respectively, and/or that at least one laser bar is provided between two respective consecutive heat sinks in the heat sink array, and/or that at least one laser bar is provided only between part of the heat sinks forming the heat sink array, and/or that two channels extending through the heat sinks and insulating layers are provided for the supply and return flow of the coolant, and/or that at least one compensating layer is applied to the surfaces of the heat sink array forming the a top and/or bottom side, and/or that the at least one compensating layer is made of the material of the at least one insulating layer and/or of a material that has the same or essentially the same thermal expansion coefficient as the at least one insulating layer, and/or that the at least one compensating layer is made of the material of the submounts and/or of a material that has the same or essentially the same thermal expansion coefficient as the submounts, and/or that the at least one insulating layer has the same volume or essentially the same volume as the at least one insulating layer or one submount, for example is identical or essentially identical in size and weight to the at least one insulating layer or the submount, and/or that the at least one compensating layer is bonded to the heat sink in the same manner as the at least one insulating layer adjacent to the heat sink or the submount adjacent to the heat sink, and/or that the depth of the gap formed between the at least two heat sinks is at least 8 mm, wherein the above characteristics can be provided individually or in any combination.

Further embodiments, advantages and possible applications of the invention are disclosed by the following description of exemplary embodiments and the drawings. All described and/or visually depicted characteristics are subject matter of the invention, individually or in any combination, regardless of their being summarized in the claims being referred back to. The content of the claims is also included as part of the description.

BRIEF DESCRIPTION OF THE DRAWINGS

The invention is explained below in more detail based on exemplary embodiments with reference to the drawings, wherein:

FIG. 3 is a perspective view of a laser bar, together with two submounts applied to the laser bars;

FIG. 4 is a schematic depiction of the mounting of the laser chip between two heat sinks of the heat sink array;

FIG. 5 is an enlarged partial view of the heat sink array in the area of two adjacent heat sinks on the back side of the diode laser array;

DETAILED DESCRIPTION OF THE INVENTION

Figure 1:
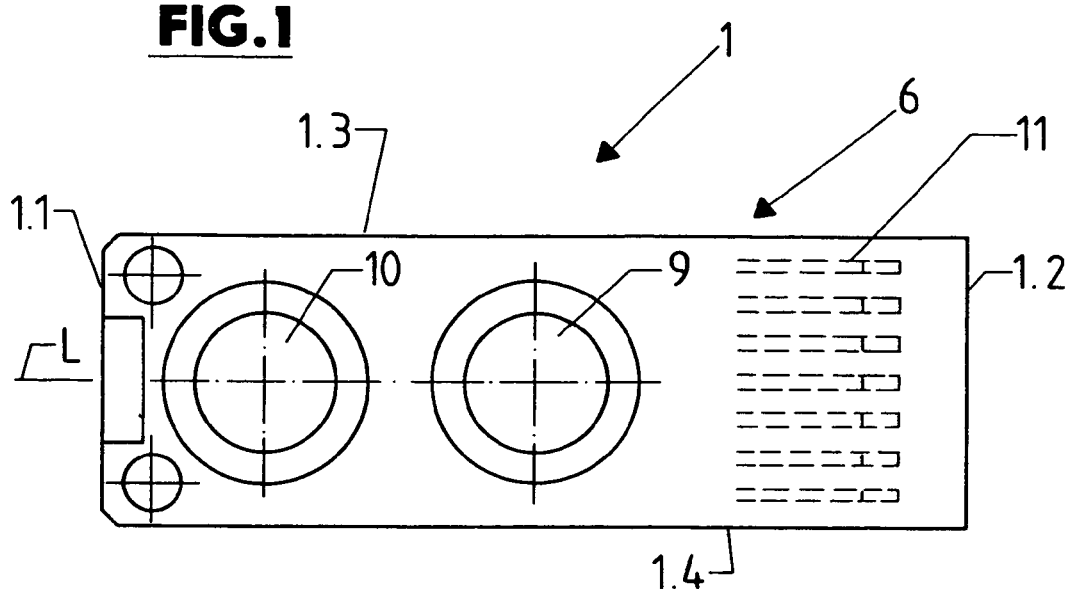
FIGS. 1 and 2 show a diode laser array according to the invention in top view and in side view.

The diode laser array generally designated 1 in the drawings includes several heat sinks 2 arranged on top of each other in the manner of a stack and of several laser bars 3, located between the heat sinks 2 and also electrically connected with the latter, each laser bar comprising a plurality of emitters that emit laser light.

The heat sinks 2 are active heat sinks or coolers (micro coolers), which are flowed through with a coolant, for example water. For this purpose each heat sink 2 consists of a plurality of layers or foils 4 and 5 made of a metal, for example copper. The layers 4 and 5 are bonded to each other using a suitable process, for example DCB technology or active soldering. The layers 4 and 5 located between the outer layers, i.e. in the depiction in FIG. 2 between the top and bottom layer 5, are each structured, i.e. provided with openings and cut-outs, resulting in flow channels for the coolant in these layers, the channels being tightly sealed toward the outside by the outer layers, i.e. in the depiction in FIG. 2 by the top and bottom layers 5.

The heat sinks 2, which are rectangular in top view in the depicted embodiment, are bonded to each other, stacked one on top of the other, to form a cube-shaped heat sink array 6, so that an insulating layer 7 made of an electrically insulating material is provided between two consecutive heat sinks 2 in the stack. Said insulating layer extends starting from the back side 1.1 of the narrow side of the heat sink array 6 forming the diode laser array toward the narrow side of the heat sink array 6 forming the front side 1.2 of the diode laser array, but ends at a distance from said front side 1.2. This produces a gap 8 in the area of the front side 1.2 between two adjacent heat sinks 2, which (gap) is open both toward the front side 1.2 and toward the two longitudinal sides 1.3 and 1.4 of the diode laser array 1.

The insulating layers 7 are for example made of ceramic, for example of an aluminum oxide and/or aluminum nitride ceramic. Further, the insulating layers 7 are bonded two-dimensionally to the heat sinks 2 using a separate technology, for example DCB technology or active soldering or hard soldering.

For the supply of the coolant to the individual heat sinks 2 or to the channels there and for the return flow of the coolant from the heat sinks 2, two channels 9 and 10 are provided in the heat sink array 6, which (channels) are oriented with their axes perpendicular to the top and bottom of the heat sinks 2 and also perpendicular to the insulating layers 7 and are also offset from each other in the longitudinal direction of the heat sinks 2. The heat sink array 6 is connected to a cooling circuit not depicted by means of the channels 9 and 10, of which channel 9 is the forward flow, for example, and channel 10 is the return flow for the coolant. The channels 9 and 10 are each formed by congruently located holes in the heat sinks 2 or in the layers 4 and 5 there and in the insulating layers 7 and are connected in a suitable manner within the heat sinks 2 with the cooling channels, which extend to the front side 1.2 of the diode laser array 1 as indicated schematically by 11 in the drawings.

A submount 12 is applied to each laser bar 3 on both sides, namely by soldering with a suitable solder, for example with an AuSn hard solder. Each submount 12 is designed so that it covers the laser bar 3 on a surface over the entire length, lies with a longitudinal side flush with the longitudinal side of said bar forming the output side or the output mirror of the laser bar 3 and protrudes with the opposite longitudinal side slightly over the longitudinal side forming the highly reflective end mirror of the laser bar 3, for example by several 100 µm. Each submount 12 in the depicted embodiment has a thickness that is somewhat greater than the thickness of the laser bar 3 and is made of a material through which a compensation of the different thermal expansion coefficients of the metal (for example copper) of the heat sinks 2 and of the semiconductor material of the laser bars 3 can be achieved. A suitable material for the submounts is a CuW allow, for example.

Each laser bar 3 provided on both sides with a submount 12 is inserted in a gap 8 so that the laser bars 3 oriented with their output side perpendicular to the longitudinal extension of the heat sinks 2 lie flush or approximately flush with the front side 1.2 of the diode laser array 1. The submounts 12 are connected by soldering, for example hard soldering, with the respective adjacent heat sink 2, both thermally and electrically. The thermal bond achieves optimum cooling of each laser bar 3 both on its n-side and on its p-side, namely by means of the adjacent active heat sink 2 with the cooling channels 11 extending into the mounting area of the laser bars 3. The two metallic heat sinks 2 adjacent to each laser bar 3 and electrically insulated by the insulating layer 7 enables an easy electrical contact or supply of the laser bars 3. The laser bars 3 can be electrically operated either parallel or in series.

The metallic submounts 12 also achieve a contact of the individual emitters of each laser bar 3 on their p-side and n-side.

The manufacture of the diode laser array 1 takes place for example in the manner that first the individual heat sinks are manufactured using the metallic layers 4 and 5 provided with the openings for the channels 9 and 10 and with the profiling for the cooling channels 11, after which the heat sink arrays 6 are manufactured using said heat sinks 2 and the insulating layers 7 that are likewise provided with the openings for the channels 9 and 10.

The laser bars 3 provided with the submounts 12 are then inserted from the front side 1.2 into the slots 8 of the respective heat sink array 6 (FIG. 3) and fastened there at least temporarily by clamping, as indicated in FIG. 4. In this process, each submount 12 is already provided with a solder layer 13 on its surface facing away from the laser bar 3. After insertion of all laser bars 3 provided with the submounts 12 into the slots 8, the submounts 12 are soldered to the respective adjacent heat sinks 2 by heating the entire bond to a temperature above the melting point of the solder layers 13, however without reaching the melting point of the solder used for the bond between the laser bars 3 and the submounts 12.

The individual heat sinks 2 and the ceramic insulating layers 7 located between said heat sinks are bonded to each other by means of suitable processes, for example by direct bonding (DCB technology) or active soldering, to form a monolithic block forming a heat sink array 6, namely resulting in a completely mirror-symmetrical structure to the middle plane, which extends in the middle between the top and bottom side of the heat sink array and parallel to these sides.

Since each laser bar 3 is provided on both sides with a submount 12 and since the solder bond of the submount allocated to each laser bar 3 with the respective adjacent heat sink 2 takes place simultaneously, the invention prevents bending or deformation of the laser bars 3 on one or more axes parallel to their active layer, therefore preventing an unwanted smile effect, especially also during cooling of the solder used for the solder bond. The submounts 12 provided on both sides of each laser bar 3 are preferably identical in design, but at least designed so that their material volume and/or thermal behavior are the same.

During soldering of the laser bars 3 inserted into the slots 8 and provided on both sides with the metallic submounts, the entire heat sink array 6 is heated, for example to the soldering temperature. A suitable design and choice of material ensure that no changes occur in the gap width of the slots 8 during the soldering process.

This achieves a low-stress mounting of the laser bars 3. For this purpose, the heat sinks 2 and insulating layers 7 have the same thickness and size in the heat sink array 6. Also, all insulating layers 7 in the depicted embodiment, in a viewing direction perpendicular to the top side of the heat sink array 6, are congruent with each other. The same applies to the heat sinks.

Figure 2:
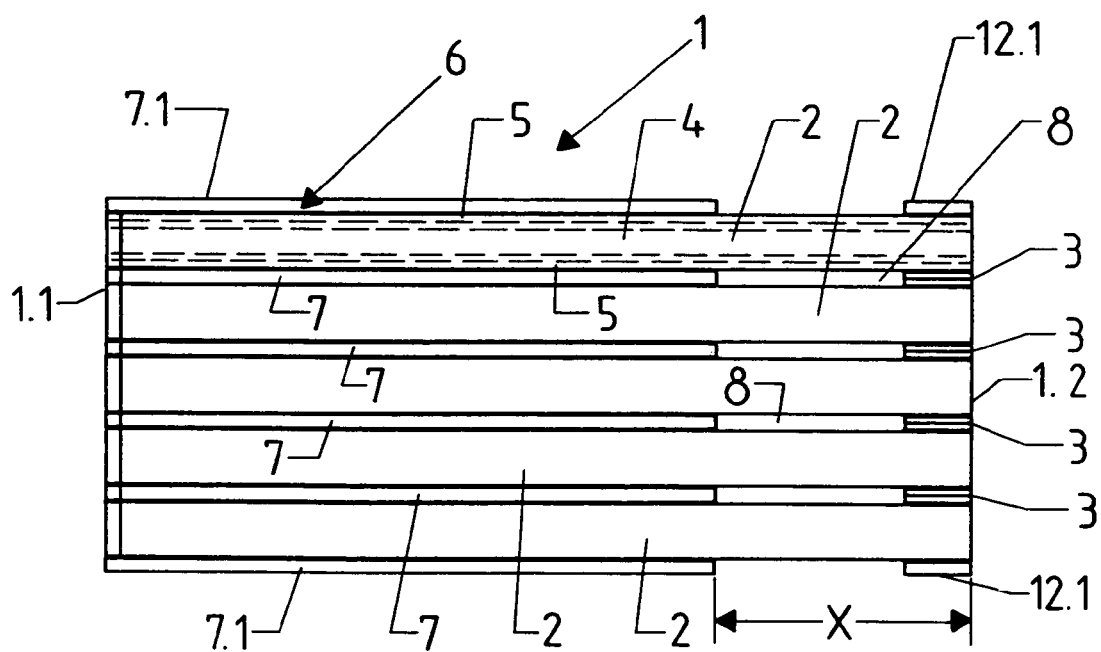

Compensating elements are preferably provided on both ends of the stack forming the heat sink array 6. These compensating elements prevent the elements forming the top and bottom side of the heat sink array 6, i.e. the outer heat sinks 2 there, from becoming deformed or arched during heating and in particular during the soldering process, namely due to different thermal expansion coefficients between the outer heat sinks 2 and the respective adjacent inner insulating layer 7. Suitable compensating elements are additional insulating or ceramic layers, which are indicated in FIG. 2 by 7.1 and which are identical in thickness and shape with the insulating layers 7 and lie directly opposite from the inner insulating layers 7.

Due to the additional insulating layers 7.1 the outer heat sinks 2 with regard to the adjacent insulating layers 7 and 7.1 are also mirror-symmetrical to an imaginary middle plane extending between the insulating layers 7 and 7.1, so that the temperature-related arching of the outer heat sinks 2 (due to the bi-metal effect) and therefore a resulting change in the width of the respective slot 8 during the soldering process and resulting mechanical stress on the laser bars 3 is prevented.

Preferably a plate-shaped compensating element 12.1 is also soldered onto the top and bottom side respectively of the heat sink array 6 during soldering of the laser bars 3 provided with the submounts 12, which (compensating element) is identical in shape, size and material to the metallic submounts 12. This also achieves identical conditions during the soldering process and in particular during the cooling of the solder on both sides of the outer heat sinks 2, therefore preventing temperature-related deformation of said heat sinks and therefore deformation of the laser bars 3. Each compensating element 12.1 is located directly opposite from a submount 12.

To prevent destruction or damage to the laser bars 3 by mechanical effects, it must be assured that after mounting, the laser bar 3 is free of mechanical tensile or compressive forces, in any case tensile and compressive forces greater than 20N on the respective laser bar. This is achieved in the manner described above by preventing temperature-related deformation or arching of the heat sink array 6, in particular by use of the compensating elements 7.1 and 12.1. Important in this regard is also that each gap 8 must have a sufficient depth x in the direction of the longitudinal axis L, i.e. that the distance between the front side 1.2 of the diode laser array 1 or the heat sink array 6 and the side of the insulating layers 7 facing said front side must be sufficiently large, i.e. the heat sinks 2 must protrude sufficiently over the insulating layers 7, so that the heat sinks 2 with their area protruding over the insulating layer 7 are sufficiently flexible to compensate mechanical tensions (tensile or compressive forces) during mounting and during operation. In this respect, the gap depth x is at least 8 mm in a preferred embodiment.

Figure 6:
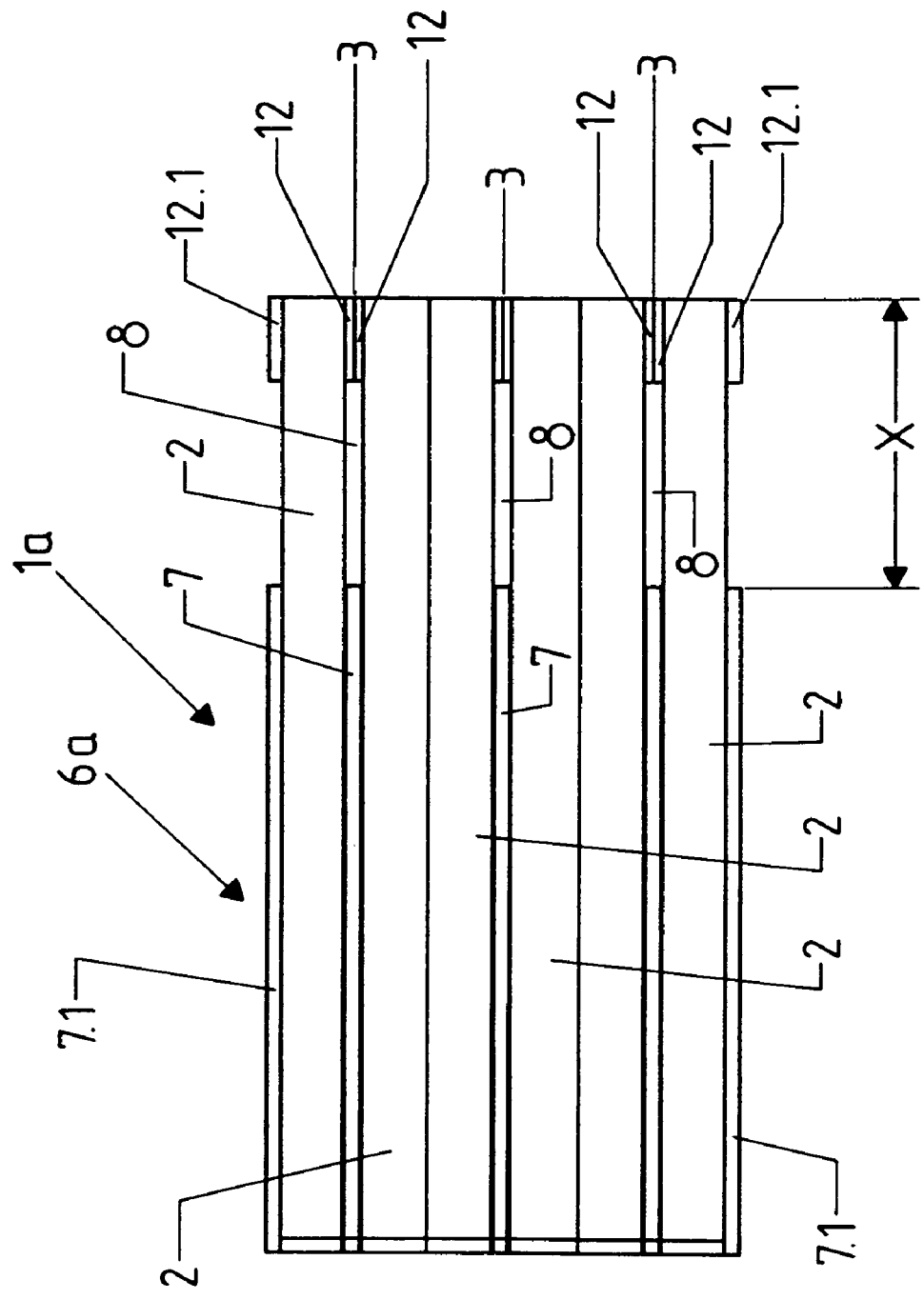
FIGS. 6 and 7 are depictions similar to FIG. 2 of further embodiments.

While it was assumed in the foregoing description that an insulating layer 7 is provided respectively between two adjacent heat sinks 2 in the stacked heat sink array 6, FIG. 6 shows as a further possible embodiment a diode laser array 1a with a heat sink array 6a, in which in the interior of the stacked heat sink array two heat sinks 2 adjoin directly, i.e. the distance between two laser bars 3 on the front side 1a.2 of the diode laser array corresponds not to the single, but rather to the double thickness of the heat sinks 2. The laser bars 3 in this embodiment are then alternatively polarized in the slots 8, for example so that in the depiction in FIG. 6 starting from the top side of the topmost laser bar 3 with its n-side on top, the next lower laser bar is arranged with its p-side on top, the next lower laser bar 3 is again arranged with its n-side on top, etc.

Figure 7:
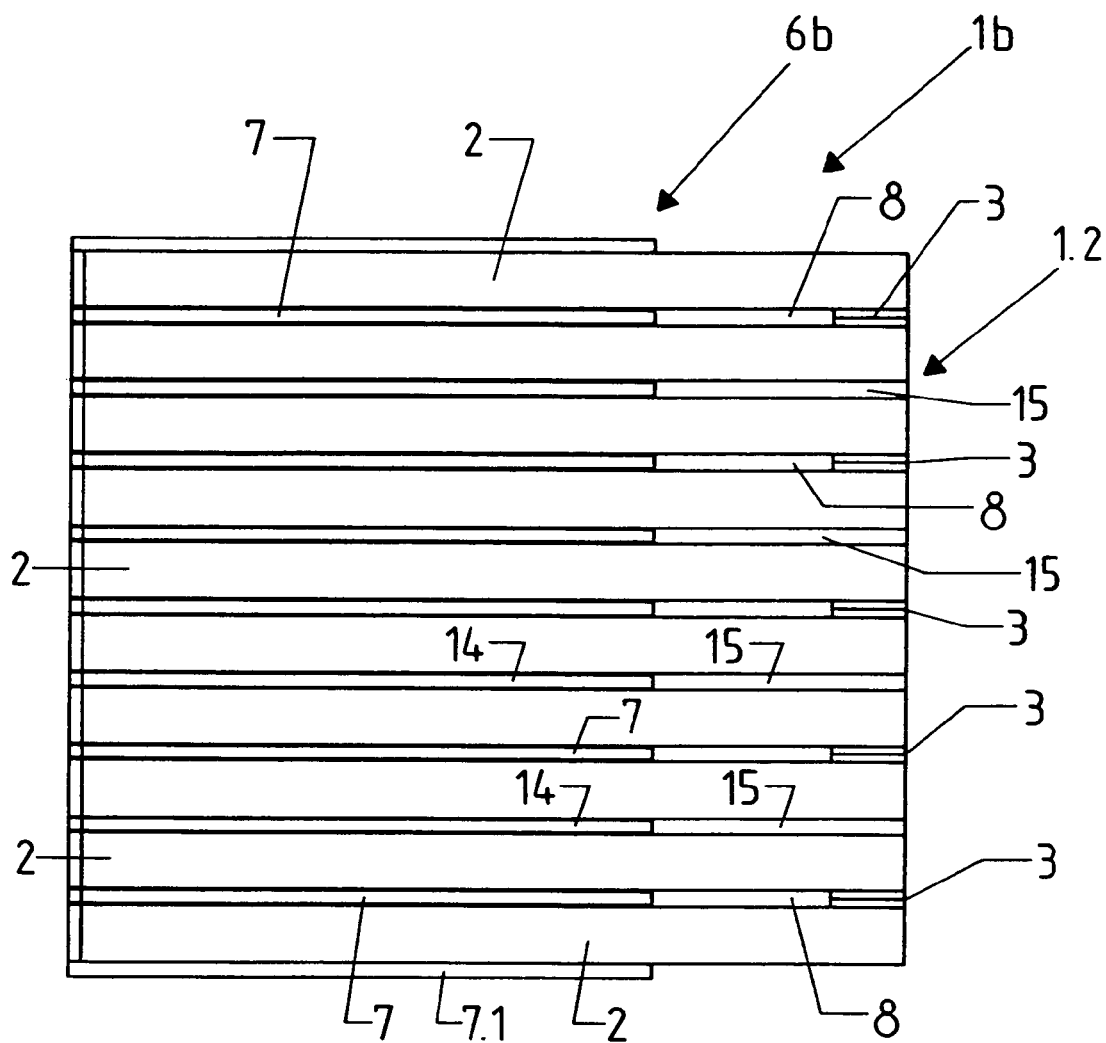

FIG. 7 shows as a further possible embodiment a diode laser array 1b, which differs from the diode laser array 1a in that in the stack forming the heat sink array 6b between the heat sinks 2 there not separated from each other by an insulating layer 7, a thick metal layer 14, for example a copper layer, is provided respectively, which, just as the insulating layers 7, ends at a distance x or a distance corresponding to this distance from the front side 1.2 of the diode laser array 1b or the heat sink array 6b, so that a gap 15 is formed between the heat sinks 2 provided on both sides of the metal layer 14 on the front side 1.2, which (gap) does not serve to hold a laser bar 3 with submounts 12. Each gap 15 enables the elastic deformation of the adjacent heat sink 2 and therefore likewise serves to compensate or reduce forces impacting the laser bar 3. On the front side 1.2, therefore, slots 8 alternate with laser bars and submounts 12 with slots 15.

The heat sink array or arrangement 6b is also provided with a compensating layer 7.1, for example in the form of a ceramic layer, on the top and bottom side, respectively. The further compensating layers 12.1 are not present in the depicted embodiment. In principle, however, such compensating layers 12.1 can also be used in the heat sink array 6b for producing a complete symmetry, not only on the top and bottom side of the heat sink array 6b, but also in the slots 15, namely on the heat sinks 2 opposite from the submount 12 of the respective laser bar 3.

Figure 8:
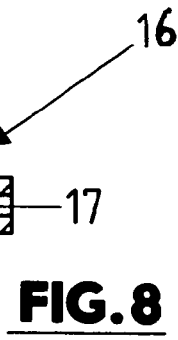
FIG. 8 is a component drawing in cross section of a compensating layer for use in the diode laser array according to the invention.

FIG. 8 shows a simplified depiction in cross section of a compensating layer 16, which can be used instead of the compensating layers 7.1 in the diode layer arrays 1, 1a and 1b and in their heat sink arrays 6, 6a, 6b.

The compensating layer 16 is designed with multiple layers, i.e. it consists of a layer 17 that serves as a compensating layer and is identical to the insulating layers 7 with regard to material, size and thickness, i.e. in particular is also made of the ceramic of the insulating layer 7. The layer 17 is provided on each of its surface sides with a metallization 18 and 19, preferably with a metallization of copper, which is applied by means of DCB technology or by active soldering to the layer 17. The metallization 8 is structured, for example. Further, the compensating element 16 comprises at least one through-connection 20, by means of which the two metallizations 18 and 19 are electrically connected with each other.

By means of the metallization 19 the compensating element 16 is bonded in a suitable manner, for example by hard soldering, DCB bonding or another suitable manner, to the outer surface of the heat sink 2 on the top or bottom side of the heat sink array 6, 6a, 6b. Of course, for reasons of symmetry, when a compensating element 16 is used on the top side of the heat sink array, another compensating element 16 is used on the bottom side of the heat sink array, as well. The metallizations 18 of the two compensating elements 16 in this embodiment form connections for the supply and return of the electric current for operating the laser bars 3 or the emitters formed by said laser bars 3.

Alternatively, it is also possible to provide each of the compensating layers 7.1 on their surface side facing away from the heat sink array 6, 6a, 6b with the metallization 18, which is then electrically connected by means of a through-connection corresponding to the through-connection 20 with the adjacent heat sink 2 consisting of an electrically conductive material or metal (e.g. copper), therefore eliminating the metallization 19.

Due to the use of the metallizations 18 and 19 on the two surfaces of the layer 17, the compensating element 16 itself also has a symmetrical design and is therefore not subject to thermally induced deformations.

As in the diode laser arrays 1 and 1a, the heat sinks 2 provided on both sides of a laser bar 3 and the corresponding submounts are likewise identical in the diode laser array 1b, in particular also with respect to the material used and the size and thickness of the heat sink.

In the diode laser array 1, 1a or 1b it is also possible to use the solder between the respective submount 12 and the adjacent heat sink 2 for a tolerance compensation, for example a tolerance compensation between 2 and 50 µm.

For the sake of simplicity in the foregoing description, diode laser arrays were shown that have a limited number of slots 8 and therefore a limited number of laser bars 3. Preferably the number of slots 8 with laser bars 7 is selected so that the respective diode laser array 1, 1a or 1b comprises a total of 4-15 slots 8 with laser bars 3.

The electrical connection of the diode laser array 1, 1a or 1b to an electrical power supply not depicted is achieved either via the outer heat sinks or via the metallizations or metal layers 18 of the compensating elements 18 or via the metallizations on the compensating layers 7.1 corresponding to the metal layers 18.

It was assumed in the foregoing description that in the manufacture of the laser diode array 1 or 1a, the respective heat sink array 6, 6a or 6b is first manufactured, after which laser bars 3 provided on both sides with the submounts 12 are inserted into the slots 8 and the submounts are then bonded to the adjacent heat sinks through the solder layer 13.

A further possible manufacturing method is to provide the laser bars 3 on both sides with submounts 12 using a special solder, for example the AuSn hard solder, and then to bond the submounts 12 to the adjacent heat sinks 2 and also to bond the heat sinks 2 and insulating layers 7 to the heat sink array 6 or 6a in a single step (e.g. hard soldering process), namely using a solder (hard solder) that has a lower melting point than the solder of the solder bond between the laser bars 3 and the submounts 12, and by heating the stack array formed by the heat sinks 2, the insulating layers 7 and the laser bars 3 with the submounts 12. During this process the stack array is weighted down by at least one weight or held together in another manner, namely so that after soldering, the thickness of the solder layer between the submount 12 and the adjacent heat sink 2 is as thin as possible, i.e. excess solder runs out at the side during the soldering process as a result of the weight, while a compensation of tolerances is achieved within the heat sink array 6 or 6a through the thickness of the solder layers. An advantage of this method is that the thickness of the solder layer bonding each of the submounts 12 with a heat sink 2 is extremely low, so that optimum heat transfer is achieved for the cooling of the laser bars 3, while the thickness of the solder layers within the heat sink array 6 or 6a has no, or no appreciable, effect on the cooling, since the cooling of the laser bars 3 is achieved only by means of the heat sinks 2 provided on both sides of each laser bar.

In the above method it is also possible, for ease of handling, to prepare the insulating layers 7 already on the heat sinks 2, namely by single-sided bonding of each insulating layer 7 to a heat sink 2, for example using DCB technology or active soldering, etc.

The invention was described above based on exemplary embodiments. It goes without saying that modifications and variations are possible without departing from the spirit of the invention. For example, it is possible to implement the insulating layers located between the heat sinks 2 so that they are provided with a metallization on at least one of their surfaces, namely in the form of a metal or copper foil, which is applied to the corresponding ceramic layer using DCB technology or active soldering.

Further, in the depiction of FIG. 6 it is possible to combine the directly adjacent heat sinks 2, i.e. without the insulating layer 7, to form a joint heat sink.

The number of laser bars 3 and heat sinks 2 can also be adapted to the respective application. In particular it is also possible to manufacture the diode laser array so that several laser bars 3 are arranged consecutively between two adjacent heat sinks 2. Further, it is also possible to manufacture the diode laser array so that it comprises only one or more laser bars between two adjacent heat sinks.

Further, it is possible to provide the heat sink array 6 or 6a on the top and/or bottom side with a further layer, for example with a metallization or insulating layer.

REFERENCE LIST 1, 1a, 1b diode laser array
1.1 back side
1.2 front side
1.3, 1.4 longitudinal side
2 heat sink designed as an active cooler
3 laser bar
4.5 layer of heat sink 2
6, 6a, 6b heat sink array
7 insulating layer or ceramic layer
7.1 compensating layer
8 slot
9, 10 channel for supply and return flow of coolant
11 cooling channels
12 intermediate support or submount
12.1 compensating layer
13 solder layer
14 copper layer
15 compensating slot
16 compensating element
17 compensating layer
18, 19 metallization
20 through-hole contact
L longitudinal extension of heat sink 2
x depth of gap

What is claimed is:

1. A diode laser array comprising at least one laser bar with at least one emitter, a heat sink array with at least two heat sinks forming a heat sink pair of first and second heat sinks, each heat sink including a top conductive metal layer and a bottom conductive metal layer with inner conductive metal layers between the top conductive metal layer and the bottom conductive metal layer in the form of an active cooler for cooling the at least one laser bar, the at least one laser bar being thermally and electrically bonded on both sides to the first heat sink and the second heat sink, respectively, so as to achieve optimum cooling of the at least one laser bar, the respective first and second heat sinks being located at least in each heat sink mounting area of the at least one laser bar, at least one insulating ceramic layer provided between the first and second heat sinks, such that a gap is formed between the first and second heat sinks for holding at least one laser bar, wherein the first and second heat sinks are bonded to the at least one ceramic insulating layer using a direct carbon bond to form a monolithic heat sink array, and wherein the first and second heat sinks only include a top conductive layer, a bottom conductive layer, and inner conductive metal layers, the conductive metal layers of each heat sink bonded together using a direct carbon bond, with inner layers being structured to form a cooling structure comprising a plurality of cooling channels.

2. The diode laser array according to claim 1, wherein an intermediate layer or a submount made of material that is at least highly thermally conductive, both highly thermally and electrically conductive, is provided in the bond between the at least one laser bar and the respective first and second heat sinks, for reduction of an effect of a different thermal expansion coefficient between semiconductor material of the at least one laser bar and a metallic material of the first and second heat sinks.

3. The diode laser array according to claim 2, wherein the intermediate layer or submount consists of a CuW alloy.

4. The diode laser array according to claim 2, wherein the at least one laser bar provided on both sides with submounts is held in a gap formed between the first and second heat sinks.

5. The diode laser array according to claim 1, wherein the at least one ceramic insulating layer provided between the first and second heat sinks is a ceramic layer selected from aluminum oxide or aluminum nitride.

6. The diode laser array according to claim 1, wherein the at least one insulating ceramic layer is provided on at least one surface bonded to an adjacent first or second heat sink, with a metal layer or foil forming the metallization, and the metallization is applied using DCB technology or active soldering.

7. The diode laser array according to claim 1, wherein the array comprises additional heat sinks bonded in a stack to form a heat sink array.

8. The diode laser array according to claim 7, wherein at least one insulating layer is provided in the heat sink array between two heat sinks located on both sides of at least one laser bar.

9. The diode laser array according to claim 7, wherein at least one laser bar is provided between two respective consecutive heat sinks in the heat sink array.

10. The diode laser array according to claim 7, wherein at least one laser bar is provided only between a part of the heat sinks forming the heat sink array.

11. The diode laser array according to claim 1, wherein at least two channels extending through the first and second heat sinks and the at least one insulating layer are provided for the supply and return flow of a coolant.

12. The diode laser array according to claim 1, wherein at least one compensating element or at least one compensating layer is applied to surfaces of the heat sink array forming a top side or a bottom side.

13. The diode laser array according to claim 12, wherein the at least one compensating element or the at least one compensating layer is made of a material of the at least one insulating layer or of a material that has the same or essentially the same thermal expansion coefficient as the at least one insulating layer.

14. The diode laser array according to claim 2, wherein the at least one compensating layer is made of a material of the submounts or of a material that has the same or essentially the same thermal expansion coefficient as the submounts.

15. The diode laser array according to claim 2, wherein the at least one compensating element or the at least one compensating layer has a same volume or essentially a same volume as the at least one insulating layer or submount, and is identical or essentially identical in size and weight to the at least one insulating layer or the submount.

16. The diode laser array according to claim 2, wherein the at least one compensating element or the at least one compensating layer is bonded to the heat sink in the same manner as the at least one insulating layer adjacent to the first or second heat sink or the submount adjacent to the first or second heat sink.

17. The diode laser array according to claim 1, wherein a depth (x) of the gap formed between the first and second heat sinks is at least 8 mm.

18. The diode laser array according to claim 12, wherein the at least one compensating element comprises the compensating layer and at least one metallization on a surface of the compensating layer facing away from the heat sink array, and that said at least one metallization is connected with the adjacent heat sink by at least one through-connection.

19. The diode laser array according to claim 18, wherein the compensating layer is provided with a metallization on a surface that is connected with the heat sink array.

20. The diode laser array according claim 2, wherein in the heat sink array, a slot is formed between at least two heat sinks in which no laser bar or a laser bar array formed by at least one laser bar and submounts is provided.

21. The diode laser array according to claim 1, wherein slots with laser bars or laser bar arrays and compensating slots alternate on a front side.

22. The diode laser array according claim 1, wherein a number of slots with laser bars or laser bar arrays is between 4 and 15.

23. The diode laser array according to claim 1, wherein a tolerance compensation between 2 and 50 μm is formed by the solder bonding a respective submount to the adjacent heat sink.

24. A diode laser array comprising a plurality of laser bars each with at least one emitter, a heat sink array with a plurality of conductive metal heat sinks, each heat sink including a top conductive metal layer and a bottom conductive metal layer with inner conductive metal layers between the top conductive metal layer and the bottom conductive metal layer in the form of an active cooler for cooling the laser bars, the heat sinks forming heat sink pairs each with a first heat sink and a second heat sink, the laser bars being each thermally and electrically bonded on both sides to the first heat sink and the second heat sink, respectively, of the respective heat sink pair so as to achieve optimum cooling of the at least one laser bar, the first and second heat sinks of the heat sink pairs being located at least in each heat sink mounting area of the laser bars, at least one insulating ceramic layer being provided between the first and second heat sinks of the heat sink pairs such that a gap is formed or left between the first and second heat sinks of the heat sink pairs for holding the at least one laser bar, wherein the first and second heat sinks of the at least one heat sink pair are bonded to the at least one insulating ceramic layer to form a monolithic heat sink array with the gap between the first and second heat sinks of the at least one heat sink pair using a direct carbon bond, wherein each of the first and second heat sinks being completely made only of the top conductive metal layer, the bottom conductive metal layer and the inner conductive metal layers which are bonded using a direct carbon bond, inner conductive metal layers being structured to form a cooling structure comprising a plurality of cooling channels.

* * * * *

UNITED STATES PATENT AND TRADEMARK OFFICE
CERTIFICATE OF CORRECTION

PATENT NO. : 8,130,807 B2
APPLICATION NO. : 12/068746
DATED : March 6, 2012
INVENTOR(S) : Jurgen Schulz-Harder et al.

Page 1 of 1

It is certified that error appears in the above-identified patent and that said Letters Patent is hereby corrected as shown below:

Title Page, item (73), should read;

Assignees: Laserline Gesellschaft fur Entwicklung und Vertrieb Von Diodenlasern mbH (Mulheim, Karlich, DE) Curamik Electronics GmbH (Eschenbach, DE)

Signed and Sealed this
Twenty-eighth Day of May, 2013

Teresa Stanek Rea
*Acting Director of the United States Patent and Trademark Office*